(12) United States Patent
Renz

(10) Patent No.: US 6,700,377 B2
(45) Date of Patent: Mar. 2, 2004

(54) SHIM DEVICE FOR A MAGNETIC RESONANCE APPARATUS

(75) Inventor: Wolfgang Renz, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/099,655

(22) Filed: Mar. 15, 2002

(65) Prior Publication Data

US 2002/0135371 A1 Sep. 26, 2002

(30) Foreign Application Priority Data

Mar. 23, 2001 (DE) .......................... 101 14 319

(51) Int. Cl.$^7$ ................................ G01V 3/00
(52) U.S. Cl. ........................ 324/318; 324/309
(58) Field of Search ............................. 324/318, 322, 324/313, 309, 311, 307; 335/301

(56) References Cited

U.S. PATENT DOCUMENTS

| | | | | |
|---|---|---|---|---|
| 4,439,733 A | | 3/1984 | Hinshaw et al. ............ 324/322 |
| 4,542,532 A | * | 9/1985 | McQuilkin ................... 455/78 |
| 4,990,877 A | * | 2/1991 | Benesch ..................... 335/301 |
| 5,237,275 A | * | 8/1993 | Takechi et al. ............ 335/301 |
| 5,343,183 A | * | 8/1994 | Shimada et al. ............ 324/320 |
| 5,681,006 A | * | 10/1997 | Herd et al. ............... 242/447.1 |
| 6,529,005 B1 | * | 3/2003 | Kasten et al. ............... 324/320 |
| 6,633,161 B1 | * | 10/2003 | Vaughan, Jr. ............... 324/318 |

FOREIGN PATENT DOCUMENTS

| | | |
|---|---|---|
| DE | 197 22 211 | 5/1997 |
| DE | 101 60 073 A1 * | 6/2003 |
| GB | 2 256 714 * | 12/1992 |

* cited by examiner

Primary Examiner—Diego Gutierrez
Assistant Examiner—Brij B. Shrivastav
(74) Attorney, Agent, or Firm—Schiff Hardin LLP

(57) ABSTRACT

A shim device for a magnetic resonance apparatus has a cavity for the acceptance of shim elements, the cavity being arranged in an antenna conductor.

14 Claims, 3 Drawing Sheets

SHIM DEVICE FOR A MAGNETIC RESONANCE APPARATUS

BACKGROUND OF THE INVENTION

1. Field of the Invention

The present invention is directed to a shim device for a magnetic resonance apparatus of the type having a cavity for the acceptance of shim elements.

2. Description of the Prior Art

German OS 197 22 211 discloses a shim device of the type described above. The shim device is arranged in a gradient coil system and has pocket-like cavities. The cavities are provided for accepting shim elements with which the static basic magnetic field of the magnetic resonance apparatus can be shaped and homogenized.

When imaging with magnetic resonance (MR) one prerequisite for generating artifact-free images is a high homogeneity of the static basic magnetic field in the imaging region. Minute inhomogeneities caused by fabrication tolerances and by ferromagnetic articles that are present in the region in which the apparatus is installed, can be eliminated with an arrangement referred to as a shim. To this end, the magnetic field is measured with an MR probe at a number of incident points that are uniformly distributed on a surface of an approximately spherical homogeneity volume. The field values are entered into a calculating program that calculates a suitable arrangement of iron plates to be attached in the interior of the magnet. After the assembly, a monitoring measurement is also implemented. This procedure usually must be repeated one or two times before a satisfactory shim result, i.e. an adequately highly uniform magnetic field, is achieved in the homogeneity volume and, thus, in the imaging region.

It is also possible to homogenize the magnetic field with correction coils. Because such coils are constructed in a rather complicated fashion for location-dependencies of a higher order, this technique is currently usually restricted to corrections of lower-order for cost reasons. A multi-channel power pack device is required for the operation of the shim coils that supplies extremely constant DC currents that can be reproducibly set. An electrical shim is usually employed for fine correction when extremely high uniformity is a matter of concern.

U.S. Pat. No. 4,439,733 discloses an antenna for a diagnostic magnetic resonance apparatus. The antenna has a number of conductor elements that are arranged on a cylindrical generated surface parallel to their axis. The conductor elements are arranged uniformly spaced from one another in circumferential direction. The antenna is part of a diagnostic magnetic resonance apparatus and is fashioned such that it can be introduced into a cylindrical interior of a superconducting magnet. The interior of the antenna is in turn large enough in order to accept a patient for producing magnetic resonance images.

In order to enhance the efficiency of shim measures, it is desirable that the shim elements required for the homogenization be arranged as close as possible to the examination space. At the same time, the shim elements should not disturb other function units of the magnetic resonance apparatus insofar as possible.

SUMMARY OF THE INVENTION

An object of the present invention is based on the object of specifying a shim device for a magnetic resonance apparatus that manages with little outlay for the shim elements.

This object is achieved in accordance with the invention in a shim arrangement wherein the cavity is arranged in an antenna conductor.

The shim device is thus as close as possible to the examination space, so that a high efficiency of the individual shim elements is achieved. It is also advantageous that the electrically conductive structures of the antenna conductor that surround the shim elements has an attenuating and shielding effect on electromagnetic disturbances proceeding from the shim elements. To that end, the skin effect, the shielding effect of the conductor itself, and the cut-off waveguide effect that is present at every waveguide structure can be utilized. This effect, however, causes an attenuation of the disturbances starting at the cut-off frequency because higher frequencies than the cut-off frequency can no longer be transmitted within the waveguide structure. Further, it is advantageous that changes of the effectiveness of the shim due to temperature, as can occur given the employment of ferromagnetic shim elements, are slight. This is particularly true compared to an arrangement of the shim elements within the gradient system. The reason for this is that the allowable temperature ranges in the transmission coil are more narrowly limited because of the proximity to the patient than the temperature ranges allowed given a gradient system. Finally, the antenna conductors are easily accessible, so that no significant disassembly and assembly outlay is necessary in the case of subsequently required shim measures in order to modify the distribution of shim elements.

An especially good shielding effect against electromagnetic disturbances proceeding from the shim elements themselves is established in an embodiment wherein the cavity is located completely within the conductor.

In another embodiment, the cavity extends in a longitudinal direction of the conductor, resulting in free distribution of the shim elements in the longitudinal direction.

In a further embodiment, the shim device has a container of non-magnetic material wherein the shaped parts are arranged and held in position. Despite the not inconsiderable magnetic field forces on the shim elements, the shim device thus remains easy to handle overall. In particular, the container with the shim elements can be removed from the conductor for changing the arrangement of the shim elements.

DESCRIPTION OF THE PREFERRED EMBODIMENTS

Figure 1:
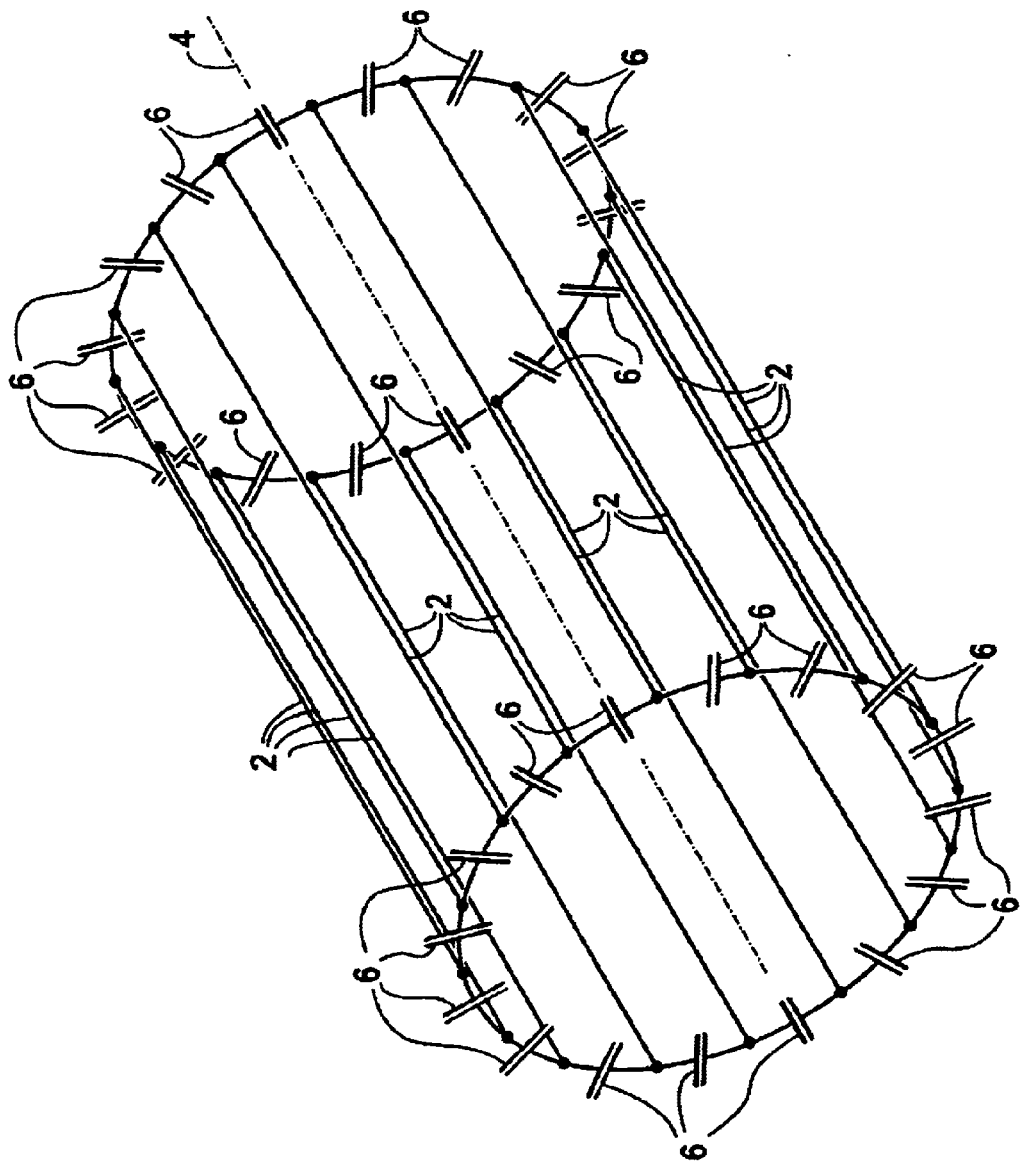
FIG. 1 is a schematic illustration of an antenna having an inventively fashioned antenna conductor.

In a perspective and schematic illustration, FIG. 1 schematically shows an antenna for a diagnostic magnetic resonance apparatus that is known as a birdcage antenna or birdcage resonator. The antenna is fashioned as a whole-body antenna such that it can be introduced into an interior of a superconducting basic field magnet. The antenna has a number of antenna conductors 2 (sixteen here) that are arranged on a generated cylindrical surface at equal distances from one another and that are aligned parallel to a symmetry axis 4 of the generated cylindrical surface. At their ends, the antenna conductors 2 are respectively electrically connected to their neighboring antenna conductors 2 via capacitors 6. The capacitors 6 are dimensioned such that the currents in the individual antenna conductors 2 are respectively shifted relative to one another by a phase angle that corresponds to the spatial angle of the position of the antenna conductors relative to one another in the circumferential direction.

Figure 2:
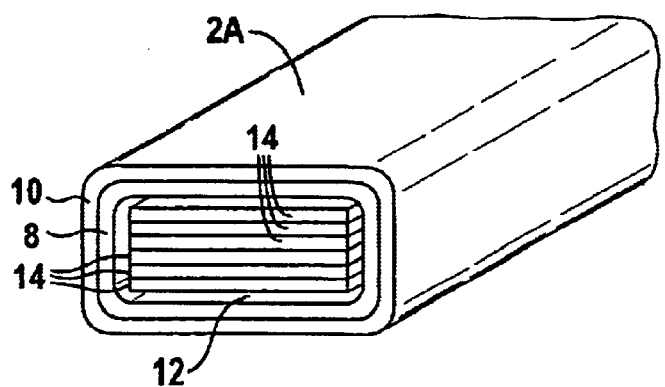
FIG. 2 is a perspective view of a first embodiment of an antenna conductor having a rectangular cross-section, with the antenna conductor surrounding a carrying tube composed of an electrically insulating material.

FIG. 2 shows a first embodiment of the antenna conductor 2A in perspective. The antenna conductor 2A has a carrier tube 8 composed of an electrically insulating material and having a rectangular cross-section. A coating 10 of copper is applied on the carrier tube 8, this coating 10 forming the actual conductive structure of the antenna conductor 2A. The copper layer 10 is fashioned precisely as thick as required by the penetration depth of the high-frequency current. A high electrical resistance is thereby established for any currents that are induced due to switched magnetic gradient fields. Due to the tubular fashioning of the antenna conductor 2A, a cavity 12 that is continuous in the longitudinal direction of the conductor is formed, shim elements 14 for homogenizing (shimming) the basic magnetic field in the magnetic apparatus being introduced thereinto from one end of the conductor 2A via an access opening. The shim elements 14 are composed of a ferromagnetic material and are plate-shaped. They can be stacked in the cavity 12 corresponding to the quantity of ferromagnetic material required for the homogenization of the basic field.

Figure 3:
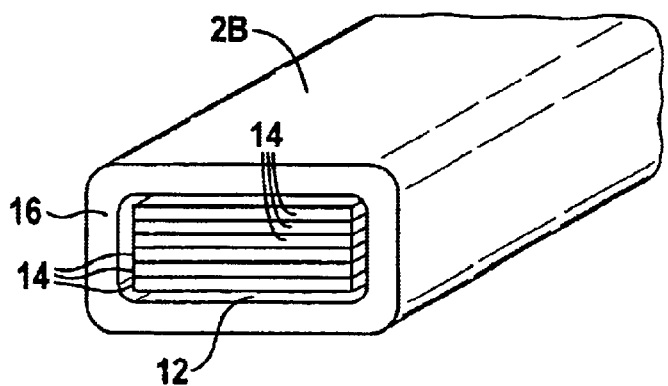
FIG. 3 is a perspective view of a second embodiment of an antenna conductor having a rectangular cross-section, with the antenna conductor fashioned as a metal tube.

FIG. 3 shows a second embodiment 2B of the antenna conductor. The antenna conductor 2B is composed of a solid copper tube 16 having a rectangular cross-section. The cavity 12 wherein the shim elements 14 can be introduced is also present here as in the embodiment shown in FIG. 2.

Figure 4:
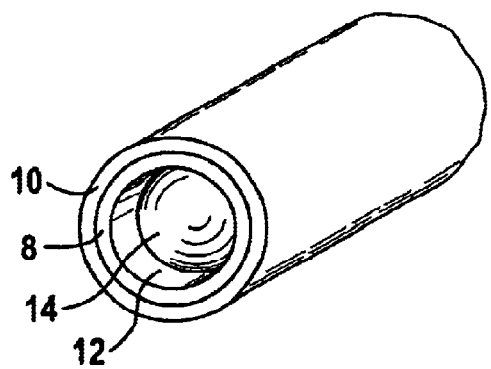
FIG. 4 is a third embodiment of the an antenna conductor having an annular cross-section, with the antenna conductor having a carrier tube composed of an electrically insulating material.

FIG. 4 shows a third version 2C of the antenna conductor 2. The antenna conductor 2C corresponds in structure to the antenna conductor 2A already described on the basis of FIG. 2, with the exception that the cavity 12 has a circular cross-section. Iron spheres are employed here as shim elements 14, these—for shimming—being successively introduced in longitudinal direction of the conductor 2B appropriately close to one another, possibly organized by spacers.

Figure 5:
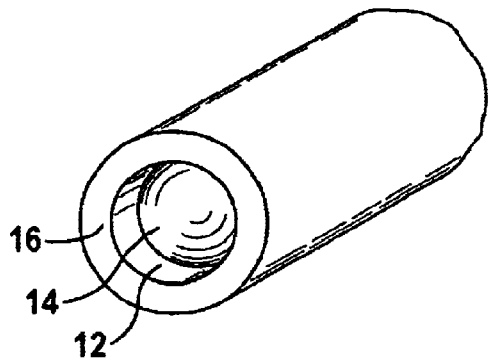
FIG. 5 is a fourth embodiment of an antenna conductor having an annular cross-section, with the antenna conductor fashioned as a metal tube.

FIG. 5 shows a fourth embodiment 2D of the antenna conductor 2 that is composed of a solid copper tube 16. This embodiment, moreover, corresponds to the embodiment already described on the basis of FIG. 4; as in FIG. 4, the cavity 12 has a circular cross-section.

Figure 6:
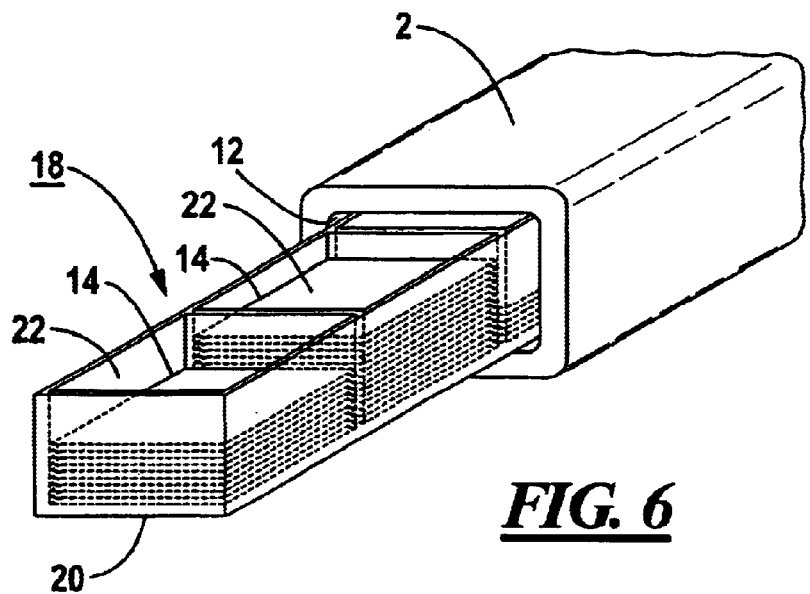
FIG. 6 is a perspective view of a shim device having a container composed of a non-magnetic material wherein shaped shim parts are arranged.

FIG. 6 shows a shim device 18 in a perspective view. For a better illustration, the shim device 18 is shown partially withdrawn from the antenna conductor 2. The shim device 18 has a housing 20 composed of a non-magnetic material in the form of a drawer having a number of chambers 22 arranged following one another. The chambers 22 are filled with a corresponding number of shim elements 14, which are plate-shaped here, for shimming the basic magnetic field. Before being introduced into the cavity 12, the chambers 22 are filled with non-magnetic plates and are then closed (not shown).

Figure 7:
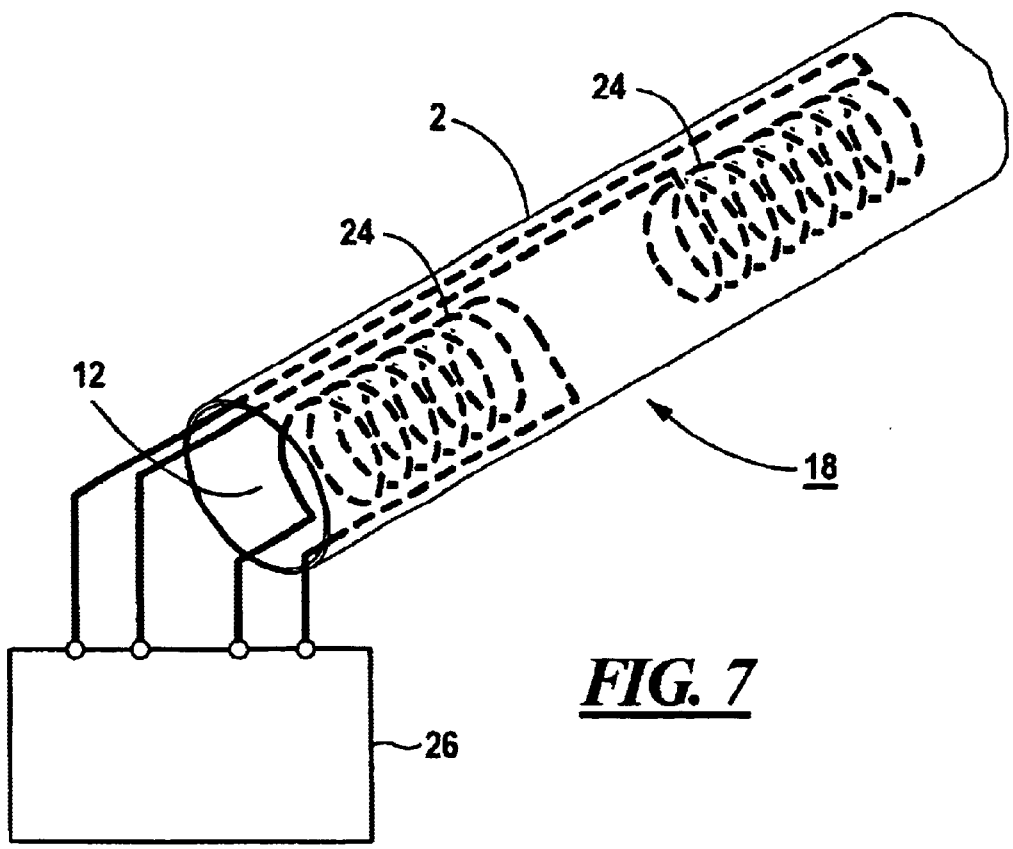
FIG. 7 is a perspective view of a shim device having separately drivable shim coils.

FIG. 7 shows an electrical shim device 18A that has shim coils 24 that can be driven independently of one another. The shim coils 24 are arranged within the cavity 12 of the antenna conductor 2 and are electrically connected to a power supply 26 at the outside. The power supply 26 supplies the highly constant DC currents required for homogenizing the basic magnetic field.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A shim device for a magnetic resonance apparatus in which a basic magnetic field is generated, comprising:

an antenna conductor having a cavity therein; and a plurality of shim elements disposed in said cavity for shimming said basic magnetic field.

2. A shim device as claimed in claim 1 wherein said cavity is situated completely within said conductor.

3. A shim device as claimed in claim 1 wherein said conductor has a longitudinal direction, and wherein said cavity extends in said longitudinal direction.

4. A shim device as claimed in claim 1 wherein said conductor has a conductor end, and wherein said cavity has an access opening disposed at said conductor end.

5. A shim device as claimed in claim 1 wherein said shim elements comprise shaped elements composed of a ferromagnetic material.

6. A shim device as claimed in claim 5 wherein said shaped elements contain iron.

7. A shim device as claimed in claim 5 wherein said shim elements comprise a plurality of stackable elements.

8. A shim device as claimed in claim 7 wherein said shaped elements are plates.

9. A shim device as claimed in claim 1 further comprising a container in which said shim elements are contained, said container being disposed in said cavity with said shim elements contained therein.

10. A shim device as claimed in claim 9 wherein said container comprises chambers for accepting said shim elements.

11. A shim device as claimed in claim 9 wherein said container comprises a drawer-like container slidable into and out of said cavity.

12. A shim device as claimed in claim 1 wherein said shim elements include an electrical conductor disposed in said cavity as one of said shim elements, adapted for electrical connection to a current source disposed outside of said cavity.

13. A shim device as claimed in claim 1 wherein said antenna conductor is a metal tube.

14. A shim device as claimed in claim 1 wherein said antenna conductor is a carrying tube composed of electrically insulating material, said carrying tube having an exterior surface covered by an electrically conductive layer.

* * * * *